(12) United States Patent
Yamanaka et al.

(10) Patent No.: US 6,841,933 B2
(45) Date of Patent: Jan. 11, 2005

(54) LIGHT-EMITTING DEVICE

(75) Inventors: Osamu Yamanaka, Aichi (JP); Mitsuhiro Nawashiro, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/171,527

(22) Filed: Jun. 14, 2002

(65) Prior Publication Data

US 2003/0122482 A1 Jul. 3, 2003

(30) Foreign Application Priority Data

Jun. 15, 2001 (JP) .................................... P2001-182543

(51) Int. Cl.[7] .......................... H01J 1/62; H01L 33/00
(52) U.S. Cl. ........................ 313/512; 428/403; 257/89
(58) Field of Search .......................... 313/512, 498, 313/501, 504, 483; 257/100, 89, 791, 160, 99; 428/403

(56) References Cited

U.S. PATENT DOCUMENTS

| | | | | |
|---|---|---|---|---|
| 5,220,243 A | * | 6/1993 | Klinedinst et al. .......... 313/502 |
| 5,753,381 A | * | 5/1998 | Feldman et al. ............ 428/696 |
| 5,847,507 A | * | 12/1998 | Butterworth et al. ....... 313/512 |
| 5,856,009 A | * | 1/1999 | Nishio et al. ............... 428/404 |
| 5,910,333 A | * | 6/1999 | Lin et al. ...................... 427/69 |
| 5,958,591 A | * | 9/1999 | Budd .......................... 428/403 |
| 5,959,316 A | * | 9/1999 | Lowery ........................ 257/98 |
| 6,011,352 A | * | 1/2000 | Haynes ....................... 313/505 |
| 6,069,440 A | | 5/2000 | Shimizu et al. |
| 6,084,250 A | * | 7/2000 | Justel et al. .................. 257/89 |
| 6,245,259 B1 | * | 6/2001 | Hohn et al. ............ 252/301.36 |
| 6,252,254 B1 | * | 6/2001 | Soules et al. ................. 257/89 |
| 6,255,670 B1 | * | 7/2001 | Srivastava et al. ........... 257/89 |
| 6,294,800 B1 | * | 9/2001 | Duggal et al. ................ 257/89 |
| 6,310,364 B1 | * | 10/2001 | Uemura ...................... 257/100 |
| 6,351,069 B1 | * | 2/2002 | Lowery et al. ............. 313/512 |
| 6,396,082 B1 | * | 5/2002 | Fukasawa et al. ............ 257/79 |
| 6,447,908 B2 | * | 9/2002 | Yun et al. ................... 428/403 |
| 6,456,002 B1 | * | 9/2002 | Klinedinst et al. .......... 313/503 |
| 6,513,949 B1 | * | 2/2003 | Marshall et al. ............ 362/231 |
| 6,552,368 B2 | * | 4/2003 | Tamai et al. .................. 257/98 |
| 2002/0043926 A1 | | 4/2002 | Takahashi et al. |

FOREIGN PATENT DOCUMENTS

JP         2000-208818         7/2000

* cited by examiner

*Primary Examiner*—Joseph Williams
*Assistant Examiner*—Dalei Dong
(74) *Attorney, Agent, or Firm*—McGinn & Gibb, PLLC (57) ABSTRACT

A light-release side of a light-emitting element having a main emission peak wavelength in a wavelength range of not longer than 500 nm is covered with a sealing resin containing organic fluorescent substance-containing silicone as an additive.

23 Claims, 5 Drawing Sheets

LIGHT-EMITTING DEVICE

The present application is based on Japanese Patent Application No. 2001-182543, which is incorporated herein by reference.

BACKGROUND OF THE INVENTION

1. Field of the Invention

The present invention relates to a light-emitting device and particularly to a light-emitting device using a light-emitting element emitting light in an ultraviolet region and at least one kind of fluorescent substance in combination.

2. Description of the Related Art

There is known a light-emitting device of the type in which a light-emitting element and at least one kind of fluorescent substance which is excited by light emitted from the light-emitting element to thereby generate fluorescence are used in combination so that light in a color different from the original color of light emitted from the light-emitting element is emitted from the light-emitting device. Particularly with the advance of the development of a light-emitting element capable of emitting light in an ultraviolet region, a trial to develop a light-emitting device capable of emitting high-luminance light has been made by using high-energy light emitted from the light-emitting element for excitation of the fluorescent substance.

For example, a light-emitting device using a light-emitting element for emitting light in an ultraviolet region and at least one kind of fluorescent substance in combination has been disclosed in Japanese Patent Publication No. 2000-208818. According to this publication, there is a proposal for a light-emitting device which is formed so that a light-emitting element for emitting light in an ultraviolet region is sealed with a silicone resin containing at least one kind of organic fluorescent substance dispersed therein.

When light in an ultraviolet region is used, it is necessary to consider particularly photo-deterioration of the member for sealing the light-emitting element. In the light-emitting device described in the publication, a silicone resin which is a material hardly deteriorated by light in an ultraviolet region is used as a sealing member to thereby prevent photo-deterioration of the sealing member.

The silicone resin is, however, low in durability against external impact because it is a soft material compared with an epoxy resin generally used as a member for sealing the light-emitting element. For this reason, both impact resistance and durability of the light-emitting element are lowered.

On the other hand, the organic fluorescent substance is used in the light-emitting device. Generally, it is thought that the organic fluorescent substance is high in light converting efficiency but is easily deteriorated by oxidization because it is highly reactive to oxygen or the like. Hence, when the organic fluorescent substance is dispersed into the sealing member uniformly as in the light-emitting device, the problem of deterioration due to oxidization arises because a part of the fluorescent substance is exposed to the outside. The deterioration of the fluorescent substance causes reduction in luminance of the light-emitting device and change in the emission color. Particularly when light in a visible region is emitted from the light-emitting element in addition to light in an ultraviolet region used for excitation of the fluorescent substance so that light obtained by mixing the light in the visible region with fluorescence generated by the fluorescent substance is radiated out, color balance is collapsed by the deterioration of the fluorescent substance so that the color of the light radiated out changes remarkably.

The surroundings of the silicone resin containing the organic fluorescent substance dispersed in the silicone resin may be coated with an epoxy resin so that both improvement in strength against external impact and prevention of deterioration of the organic fluorescent substance due to oxidization can be attained. In this case, however, an exposed portion of the fluorescent substance in the surface of the silicone resin reacts with the epoxy resin. As a result, a problem in reduction of luminance and change of the emission color caused by the deterioration of the fluorescent substance rises again.

In addition, generally, the amount of the organic fluorescent substance to be added can be hardly adjusted due to its property compared with an inorganic fluorescent substance. Hence, it is difficult to produce light-emitting devices uniform in the emission color.

SUMMARY OF THE INVENTION

The present inventors have made eager examination to solve the problem. As a result, the following configuration has been drawn as a conclusion. That is, the configuration of the invention is as follows.

A light-emitting device including:

a light-emitting element;

a sealing member for covering a light release side of the light-emitting element; and a silicone member containing at least one organic fluorescent substance and added into the sealing member.

According to this configuration, the organic fluorescent substance is added into the sealing member in a state in which the organic fluorescent substance is contained in the silicone members. Hence, a material excellent in impact resistance, such as an epoxy resin, can be used as the sealing member. Hence, the light-emitting device can be formed with high impact resistance and high durability. Moreover, because the silicone members containing the organic fluorescent substance are coated with the sealing member, deterioration of the organic fluorescent substance due to exposure to the outside can be suppressed as sufficiently as possible. Moreover, because the organic fluorescent substance exists in the sealing member in a state in which the organic fluorescent substance is contained in the silicone members, the reaction between the sealing member and the organic fluorescent substance is suppressed so that deterioration of the fluorescent substance due to the reaction is suppressed. In this manner, deterioration of the fluorescent substance due to the external environment and the sealing member can be prevented. The light-emitting device can be provided as a device causing little change in the emission color with the passage of time.

In addition, because the organic fluorescent substance is contained in the silicone members, handling property is improved to thereby make it easy to adjust the amount of the fluorescent substance to be added. Hence, light-emitting devices uniform in quality (emission color) can be produced.

DETAILED DESCRIPTION OF THE PREFERRED EMBODIMENTS

A light-emitting element exhibiting a main emission peak wavelength in a wavelength range of not longer than 500 nm is used as the light-emitting element. That is, a light-emitting element emitting light in a blue region to an ultraviolet region is used. Preferably, a light-emitting element exhibiting a main emission peak wavelength in a wavelength range of not longer than 450 nm may be used. For example, a light-emitting element exhibiting a main emission peak wavelength in a wavelength range of from 360 nm to 450 nm or a light-emitting element exhibiting a main emission peak wavelength in a wavelength range of from 360 nm to 410 nm may be used. Especially preferably, a light-emitting element exhibiting a main emission peak wavelength in a wavelength range of from 360 nm to 400 nm may be used. Light in the wavelength range can excite the fluorescent substance (which will be described later) with high efficiency so that light is emitted from the fluorescent substance. It is a matter of course that a light-emitting element further exhibiting at least one additional emission peak wavelength in a wavelength range different from the aforementioned wavelength range may be used. In addition, a light-emitting element exhibiting a plurality of emission peak wavelengths in the aforementioned wavelength range maybe used. When, for example, a light-emitting element capable of emitting light in a visible region as well as capable of emitting light in an ultraviolet region is used, the light in the ultraviolet region can be used for excitation of the fluorescent substance on one hand and the light in the visible region can be used as a part of light radiated out on the other hand. In such a configuration, fluorescence generated by the fluorescent substance and visible light emitted from the light-emitting element are mixed with each other so that the mixed light is radiated out from the light-emitting device. When, for example, a light-emitting element capable of emitting both ultraviolet light and blue light is used in combination with a fluorescent substance which is excited by the ultraviolet light to generate green or red fluorescence, light-emitting devices diversified in emission color can be formed.

For selection of the light-emitting element, the excitation peak and fluorescence color of the (organic or inorganic) fluorescent substance (which will be described later) and the color of light emitted from the light-emitting device as a whole are taken into consideration.

A plurality of light-emitting elements may be used. In this case, light-emitting elements different in emission wavelength (emission color) can be used, so that the color of light emitted from the light-emitting device as a whole can be changed or adjusted.

The material for forming the light-emitting element is not particularly limited. A light-emitting element having Group III nitride compound semiconductor layers, that is, a Group III nitride compound semiconductor light-emitting element can be preferably used. Group III nitride compound semiconductors are represented by the general formula $Al_xGa_yIn_{1-x-y}N$ ($0 \leq X \leq 1$, $0 \leq Y \leq 1$, $0 \leq X+Y \leq 1$), which includes so-called binary compounds such as $Al_xN$, GaN and InN, and so-called ternary compounds such as $Al_xGa_{1-x}N$, $Al_xIn_{1-x}N$ and $Ga_xIn_{1-x}N$ ($0<x<1$). The group III elements may be partially replaced by boron (B), thallium (Tl), etc. The nitrogen (N) maybe partially replaced by phosphorus (P), arsenic (As), antimony (Sb), bismuth (Bi), etc. An element-functional portion of the light-emitting element is preferably made of one member selected from the binary or ternary Group III nitride compound semiconductors.

Each of the Group III nitride compound semiconductors may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor may be subjected to electron beam irradiation, plasma irradiation or heating in a furnace.

Each of the Group III nitride compound semiconductors maybe formed by a metal organic chemical vapor deposition method (MOCVD method) or may be formed by a known method such as a molecular beam epitaxy method (MBE method), a halide vapor phase epitaxy method (HVPE method), a sputtering method, an ion-plating method, or an electron shower method.

The material of the substrate on which the Group III nitride compound semiconductor layers will be grown is not particularly limited if the Group III nitride compound semiconductor layers can be grown on the substrate. Examples of the material of the substrate which can be used include sapphire, spinel, silicon, siliconcarbide, zincoxide, gallium phosphide, galliumarsenide, magnesiumoxide, manganese oxide, and Group III nitride compound semiconductor monocrystal. Particularly, a sapphire substrate is preferably used. Further particularly, a surface a of the sapphire substrate is preferably used.

Examples of the material of the sealing member include epoxy resin, silicone resin, silicone rubber, silicone elastomer, urea resin, and glass. Although it is a matter of course that these materials can be used singly, at least two materials optionally selected from these materials may be used. Particularly, epoxy resin may be preferably used from the point of view of handling property and general-purpose property. When silicone resin, silicone rubber or silicone elastomer is to be used, it is preferable that the surface of the sealing member (the surface exposed to the outside) is coated with a material high in impact resistance. For example, the surface of the sealing member can be coated with a molded epoxy resin.

The sealing member is disposed so that the light-release side of the light-emitting element is covered with the sealing member. That is, light released from the light-emitting element is radiated out through the sealing member. A layer made of a material different from the material of the sealing member may be provided between the light-emitting element and the sealing member. For example, after a silicone resin is applied onto the surface of the light-emitting element, a sealing member of an epoxy resin may be formed on the silicone resin.

A light-diffusing agent may be added to the sealing member. When the light-diffusing agent is used, diffusion of light in the sealing member is promoted. Hence, the fluorescent substance can be efficiently irradiated with light emitted from the light-emitting element. When a light-emitting element also emits visible light or when a plurality of kinds of fluorescent substances are used, color mixing of the visible light emitted from the light-emitting element or fluorescence generated from each fluorescent substance can be promoted so that reduction in emission unevenness can be attained. Examples of the light-diffusing agent which can be used include titanium oxide, titanium nitride, tantalum nitride, aluminum oxide, silicon oxide, and barium titanate. A colorant may be also added to the sealing member. The colorant is used for preventing the organic fluorescent substance from exhibiting the color peculiar to the fluorescent substance.

Silicone members containing at least one kind of organic fluorescent substance are added into the sealing member. The organic fluorescent substance used is not particularly limited on kind if it can be excited by light emitted from the light-emitting element to thereby generate fluorescence. Examples of the organic fluorescent substance which can be used include: stilbene pigments such as 1,4-bis(2-methylstyryl)benzene (Bis-MSB) and trans-4,4'-diphenylstilbene (DPS); coumarin pigments such as 7-hydroxy-4-methylcoumarin (coumarin 4); BOQP; PBBO; BOT; and POPOP. Each of these fluorescent substances exhibits blue emission color. Further, DPOT, brilliantsulfoflavine FF, basic yellow HG, SINLOIHI COLOR FZ-5005 (made by Sinloihi Co., Ltd.), etc. maybe us ed as the organic fluorescent substance. Each of these fluorescent substances exhibits yellow or green emission color. Further, eosine, rhodamine 6G, rhodamine B, NKP-8303 (made by Nippon Keikou Kagaku Company), etc. may be used as the organic fluorescent substance. Each of these fluorescent substances exhibits yellow or red emission color. Further, polymethyl methacrylate (PMMA) obtained by polymerization and solidification of TB(EDTA)SSA, EuTTA, etc. dissolved in methyl methacrylate may be used.

Incidentally, a plurality of kinds of organic fluorescent substances may be used in combination. In this case, the plurality of kinds of organic fluorescent substances may be mixed before contained in the silicone members or may be contained in silicone members individually and respectively.

Silicone resin, silicone rubber or silicone elastomer can be used as silicone. Particularly, silicone resin is preferably used.

The silicone members containing the organic fluorescent substance can be prepared, for example, by impregnating cured silicone with the organic fluorescent substance or by mixing the organic fluorescent substance with uncured silicone. In the former case, silicone is molded into a suitable shape and size in advance. The silicone molded article obtained thus is impregnated with the organic fluorescent substance through the surface of the silicone molded article. For example, the silicone molded article is immersed in a solution containing the organic fluorescent substance dissolved therein, for a predetermined time. On the other hand, in the latter case, after the organic fluorescent substance is mixed with uncured silicone, the silicone is cured to obtain a suitable shape and size.

The shape and size of each silicone member is not particularly limited. In consideration of handling property, a spherical shape (ball shape) with a diameter of from 1 $\mu$m to 50 $\mu$m is preferably used. Especially, a spherical shape with a diameter of from 1 $\mu$m to 10 $\mu$m is preferably used. Because the size of an inorganic fluorescent substance generally used is of the order of microns, the silicone members having the diameter in this range can be handled in the same manner as the inorganic fluorescent substance. This means that it is a matter of course that the amount of the silicone members to be added, that is, the amount of the organic fluorescent substance to be added can be adjusted easily, and that the amount of the organic fluorescent substance to be added and the amount of the inorganic fluorescent substance to be added can be adjusted easily when the inorganic fluorescent substance is used together with the organic fluorescent substance, as will be described later.

The silicone members containing the organic fluorescent substance are added into the sealing member in a state in which the silicone members are dispersed in the sealing member uniformly or localized in a partial region of the sealing member. When the silicone members are localized on the light-emitting element side, the organic fluorescent substance can be efficiently irradiated with light emitted from the light-emitting element. To add and localize the silicone members onto the light-emitting element side, for example, the (light-release side) surface of the light-emitting element is coated with a small amount of the sealing member containing the silicone members dispersed therein, and then the sealing member containing no silicone members is laminated thereon. As another method, a plurality of sealing members different in the amount of the silicone members to be added may be prepared and laminated successively so that the amount of the silicone members to be added (that is, the amount of the organic fluorescent substance to be added) can be changed gradually as the location becomes farther from the light-emitting element side. As a further method, a plurality of sealing members into which silicone members containing different kinds of organic fluorescent substances are added respectively may be prepared and laminated successively.

In addition to the organic fluorescent substance, an inorganic fluorescent substance may be used. The inorganic fluorescent substance can be used in a state in which it is added into the sealing member. As another method, a different sealing member may be prepared so that the inorganic fluorescent substance can be added into the sealing member. When, for example, use of the inorganic fluorescent substance makes it possible to obtain more efficient fluorescence in a specific fluorescent color than use of the organic fluorescent substance in the case where a plurality of fluorescent substances are used for externally radiating fluorescence obtained by mixing the fluorescence emitted by the plurality of fluorescent substances, it is preferable that the inorganic fluorescent substance is used for the specific fluorescent color. For example, a red organic fluorescent substance and a green or blue inorganic fluorescent substance may be used in combination. When a suitable fluorescent substance good in excitation efficiency is used in accordance with the color of fluorescence, light emitted from the light-emitting element can be utilized efficiently so that luminance of the light-emitting device can be improved.

Examples of the inorganic fluorescent substance which can be used include: fluorescent substances exhibiting red emission color, such as $6MgO \cdot As_2O_5:Mn^{4+}$, $Y(PV)O_4:Eu$, $CaLa_{0.1}Eu_{0.0}Ga_3O_7$, $BaY_{0.0}Sm_{0.1}Ga_3O_7$, $Ca(Y_{0.5}Eu_{0.5})(Ga_{0.5}In_{0.5})_3O_7$, $Y_3O_3:Eu$, $YVO_4:Eu$, $Y_2O_2:Eu$, $3.5MgO \cdot 0.5MgF_2 \cdot GeO_2:Mn^{4+}$, and $(Y \cdot Cd)BO_2:Eu$; fluorescent substances exhibiting blue emission color, such as $(Ba, Ca, Mg)_5(PO_4)_3Cl:Eu^{2+}$, $(Ba, Mg)_2Al_{16}O_{27}:Eu^{2+}$, $Ba_3MgSi_2O_8:Eu^{2+}$, $BaMg_2Al_{16}O_{27}:Eu^{2+}$, $(Sr, Ca)_{10}(PO_4)_6Cl_2:Eu^{2+}$, $(Sr, Ca)_{10}(PO_4)_6Cl_2 \cdot nB_2O_3:Eu^{2+}$, $Sr_{10}(PO_4)_6Cl_2:Eu^{2+}$, $(Sr, Ba, Ca)_5(PO_4)_3Cl:Eu^{2+}$, $Sr_2P_2O_7:Eu$, $Sr_5(PO_4)_3Cl:Eu$, $(Sr, Ca, Ba)_3(PO_4)_6Cl:Eu$, $SrO \cdot P_2O_5 \cdot B_2O_5:Eu$, $(BaCa)_5(PO_4)_3Cl:Eu$, $SrLa_{0.95}Tm_{0.05}Ga_3O_7$, $ZnS:Ag$, $GaWO_4$, $Y_2SiO_5:Ce$, $ZnS:Ag$, $Ga$, $Cl$, $Ca_2B_4OCl:Eu^{2+}$, $BaMgAl_4O_3:Eu^{2+}$, and fluorescent substances represented by the general formula $(Ml, Eu)_{10}(PO_4)_5Cl_2$ (in which Ml is at least one element selected from the group consisting of Mg, Ca, Sr, and Ba);

and fluorescent substances exhibiting green emission color, such as $Y_2SiO_5:Ce^{3+}$, $Tb^{3+}$, $Sr_2Si_3O_8 \cdot 2SrCl_2:Eu$, $BaMg_2Al_{16}O_{27}:Eu^{2+}$, $Mn^{2+}$, $ZnSiO_4:Mn$, $Zn_2SiO_4:Mn$, $LaPO_4:Tb$, $SrAl_2O_4:Eu$, $SrLa_{0.2}Tb_{0.8}Ga_3O_7$, $CaY_{0.9}Pr_{0.1}Ga_3O_7$, $ZnGd_{0.8}Ho_{0.2}Ga_3O_7$, $SrLa_{0.6}Tb_{0.4}Al_3O_7$, ZnS:Cu, Al, (Zn, Cd)S:Cu, Al, ZnS:Cu, Au, Al, $Zn_2SiO_4$:Mn, $ZnSiO_4$:Mn, ZnS:Ag, Cu, (Zn,Cd)S:Cu, ZnS:Cu, GdOS:Tb, LaOS:Tb, $YSiO_4$:Ce.Tb, $ZnGeO_4$:Mn, GeMgAlO:Tb, $SrGaS:Eu^{2+}$, ZnS:Cu.Co, $MgO \cdot nB_2O_3$:Ge, Tb, LaOBr:Tb, Tm, and $La_2O_2S$:Tb. Further, $YVO_4$:Dy exhibiting white emission color or $CaLu_{0.5}Dy_{0.5}Ga_3O_7$ exhibiting yellow emission color may be used.

In addition to the sealing member (hereinafter referred to as "first sealing member"), a second sealing member may be used. The second sealing member is formed between the light-emitting element and the first sealing member or the surface of the first sealing member is covered with the second sealing member. Epoxy resin, silicone resin, urea resin or glass as listed in the description of the first sealing member may be used as the material of the second sealing member. For example, the first sealing member is made of a silicone resin and the second sealing member is made of an epoxy resin so that the first sealing member is covered with the second sealing member.

The second sealing member may contain at least one kind of fluorescent substance (inclusive of an organic fluorescent substance and an inorganic fluorescent substance), a light-diffusing agent, and/or a colorant. The second sealing member may further contain an ultraviolet absorber. When such an ultraviolet absorber is used, light in an ultraviolet region which is not used for excitation of the fluorescent substance can be absorbed to the second sealing member so that light in the ultraviolet region can be prevented from being radiated out. For example, 2-(2-hydroxy-3,5-di-t-butylphenyl)-5-chlorobenzotriazole can be used as the ultraviolet absorber.

The configuration of the invention will be described below more in detail in connection with embodiments thereof.

(Embodiment 1)

Figure 1:
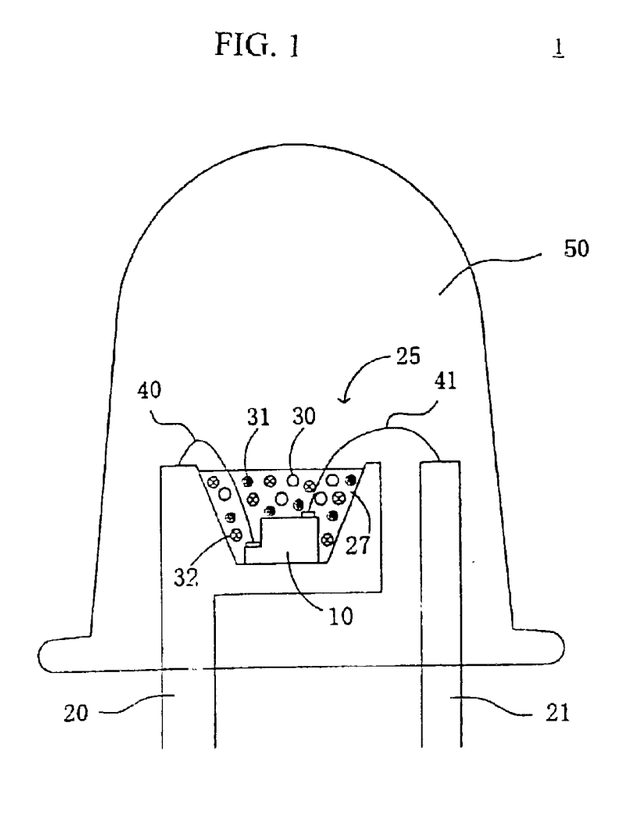
FIG. 1 is a view showing a round type LED 1 as an embodiment of the invention.

FIG. 1 is a view showing a round type LED 1 as an embodiment of the invention. The LED 1 emits white light and, for example, can be used in combination with a light guide for forming a surface light source or a linear light source. Further, the LED 1 can be used for various kinds of display devices.

Figure 2:
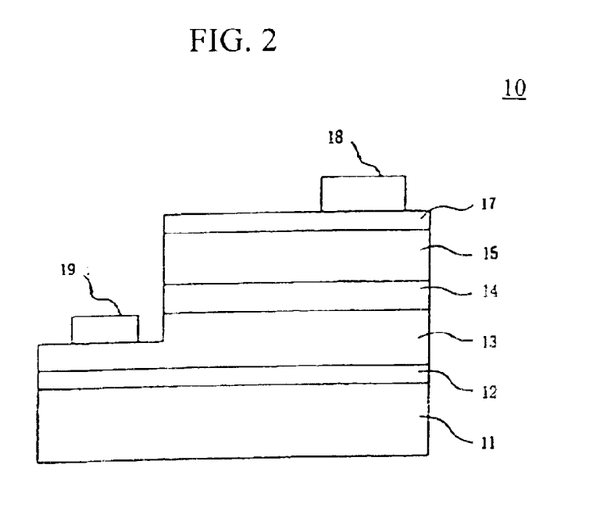
FIG. 2 is a schematic sectional view of a light-emitting element used in the LED.

FIG. 2 is a sectional view schematically showing a light-emitting element 10 used in the LED 1. The light-emitting element 10 has a sapphire substrate, and a plurality of Group III nitride compound semiconductor layers laminated on the sapphire substrate. The light-emitting element 10 exhibits an emission peak at a wave length of about 380 nm. Specifications of respective layers in the light-emitting element 10 are as follows.

| Layer | Composition |
| --- | --- |
| p-type layer 15 | p-GaN:Mg |
| Light-emitting layer-containing layer 14 | Inclusive of InGaN layer |
| n-type layer 13 | n-GaN:Si |
| Buffer layer 12 | AlN |
| Substrate 11 | Sapphire |

The n-type layer 13 of GaN doped with Si as n-type impurities is formed on the substrate 11 through the buffer layer 12. Although this embodiment shows the case where a sapphire substrate is used as the substrate 11, the invention is not limited thereto. Examples of the material of the substrate 11 which can be used include sapphire, spinel, silicon, silicon carbide, zinc oxide, gallium phosphide, gallium arsenide, magnesium oxide, manganese oxide, and Group III nitride compound semiconductor monocrystal. Although this embodiment also shows the case where the buffer layer 12 is made of AlN by an MOCVD method, the invention is not limited thereto. For example, GaN, InN, AlGaN, InGaN, or AlInGaN may be used as the material of the buffer layer 12. A molecular beam epitaxy method (MBE method), a halide vapor phase epitaxy method (HVPEmethod), a sputtering method, an ion-plating method, an electron shower method, etc. may be used as the method for producing the buffer layer 12. When Group III nitride compound semiconductor is used as the substrate 11, the buffer layer 12 can be omitted.

The substrate and the buffer layer may be removed in accordance with necessity after the formation of the semiconductor element.

Although this embodiment shows the case where the n-type layer 13 is made of GaN, the invention may be applied also to the case where AlGaN, InGaN or AlInGaN is used as the material of the n-type layer 13.

Further, although this embodiment shows the case where the n-type semiconductor layer 13 is doped with Si as n-type impurities, the invention may be applied also to the case where Ge, Se, Te, C, or the like, is used as n-type impurities.

The n-type layer 13 may be of a double-layer structure with an $n^-$ layer of low electron density on the light-emitting layer-containing layer 14 side and an $n^+$ layer of high electron density on the buffer layer 12 side.

The light-emitting layer-containing layer 14 may contain a quantum well structure (multiple quantum well structure or single quantum well structure). Further, the structure of the light-emitting element may be of a single hetero type, a double hetero type or a homo-junction type.

The light-emitting layer-containing layer 14 may contain a Group III nitride compound semiconductor layer provided on the p-type layer 15 side, doped with an acceptor such as magnesium and having a wide band gap. This arrangement is made for effectively preventing electrons injected into the light-emitting layer-containing layer 14 from diffusing into the p-type layer 15.

The p-type layer 15 made of GaN doped with Mg as p-type impurities is formed on the light-emitting layer-containing layer 14. Alternatively, the p-type layer 15 may be made of AlGaN, InGaN or InAlGaN. Zn, Be, Ca, Sr or Ba may be used as p-type impurities instead.

Further, the p-type layer 15 may be of a double-layer structure with a $p^-$ layer of low hole density on the light-emitting layer-containing layer 14 side and a $p^+$ layer of high hole density on the electrode side.

In the light-emitting diode configured as described above, each of the Group III nitride compound semiconductor layers may be formed by an MOCVD method in a general condition or may be formed by a method such as a molecular beam epitaxy method (MBE method), a halide vapor phase epitaxy method (HVPE method), a sputtering method, an ion-plating method, or an electron shower method.

The n electrode 19 is composed of two layers of Al and V. After the p-type layer 15 is formed, the p-type layer 15, the light-emitting layer-containing layer 14 and the n-type layer 13 are partially removed by etching. In this condition, the n electrode 19 is formed on the n-type layer 13 by vapor deposition.

The light-transmissive electrode 17 is a thin film containing gold and is laminated on the p-type layer 15. The p electrode 18 is also made of a material containing gold and is formed on the light-transmissive electrode 17 by vapor deposition.

After the respective semiconductor layers and the respective electrodes are formed by these steps, a step of separating the substrate into chips is carried out.

A reflecting layer may be provided between the light-emitting layer-containing layer 14 and the substrate 11 or on a surface of the substrate 11 where the semiconductor layers are not formed. When the reflecting layer is provided, light emitted from the light-emitting layer-containing layer 14 toward the substrate side can be reflected toward the light-extracting direction efficiently. As a result, improvement of light-emitting efficiency can be attained. The reflecting layer can be formed of at least one member selected from the group consisting of titanium nitride, zirconium nitride, and tantalum nitride. Alternatively, the reflecting layer may be made of a single metal selected from the group consisting of Al, In, Cu, Ag, Pt, Ir, Pd, Rh, W, Mo, Ti, and Ni, or may be made of an alloy composed of at least two metals optionally selected from the group.

The light-emitting element 10 is mounted, through an adhesive agent, into a cup-like portion 25 provided in a lead frame 20. The adhesive agent is silver paste which contains an epoxy resin, and silver as a filler mixed with the epoxy resin. When such silver paste is used, heat can be better radiated from the light-emitting element 10. Incidentally, the silver paste may be replaced by another known adhesive agent such as transparent paste or white paste.

The p electrode 18 and the n electrode 19 in the light-emitting element 10 are wire-bonded to lead frames 21 and 20 by wires 41 and 40 respectively.

Then, the cup-like portion 25 is filled with an epoxy resin 27 containing silicone balls 30, 31 and 32 which are impregnated with different kinds of organic fluorescent substances respectively and which are dispersed into the epoxy resin 27 uniformly (hereinafter, referred to as "fluorescent substance resin 27"). The silicone balls 30, 31 and 32 are impregnated with a red organic fluorescent substance NKP-8303 (made by Nippon Keikou Kagaku Company), a green organic fluorescent substance SINLOIHI COLOR FZ-5005 (Sinloihi Co., Ltd.) and a blue organic fluorescent substance 1,4-bis (2-methylstyryl)benzene (Bis-MSB) respectively. The silicone balls 30, 31 and 32 are produced by the following method. First, liquid silicone is cured while molded into a spherical shape (silicone ball) with a diameter of about 5$\mu$m. The silicone ball obtained thus is immersed in a solution in which an organic fluorescent substance to be used for impregnation is dissolved, for about 3hours. Incidentally, the immersion time is adjusted suitably in consideration of the impregnation efficiency.

The amount of each of the three kinds of silicone balls 30, 31 and 32 to be added to the epoxy resin is determined in consideration of the amount of a corresponding kind of organic fluorescent substance contained in the silicone balls, the fluorescence generating efficiency of the organic fluorescent substance, the color of light emitted from the light-emitting device 1, and so on.

Although this embodiment has shown the case where a red organic fluorescent substance, a green organic fluorescent substance and a blue organic fluorescent substance, that is, three kinds of organic fluorescent substances are used, the invention may be applied also to the case where only one kind of organic fluorescent substance is used or two kinds of organic fluorescent substances are used in accordance with the required emission color.

The fluorescent substance resin layer 27 is formed by potting the epoxy resin containing the silicone balls 30, 31 and 32 dispersed therein in the cup-like portion 25 after mounting the light-emitting element 10 into the cup-like portion 25. Incidentally, besides potting, the fluorescent substance resin layer 27 may be formed by another method such as sputtering, application, or painting.

The fluorescent substance resin layer may be formed so that the surface of the light-emitting element 10 is coated with the fluorescent substance resin layer. For example, the light-emitting element 10 may be dipped in the epoxy resin containing the silicone balls 30, 31 and 32 dispersed therein, so that the surface of the light-emitting element 10 is coated with the fluorescent substance layer. After the dip coating, the light-emitting element 10 may be mounted into the cup-like portion 25. Also by this method, the surface of the light-emitting element 10 can be coated with the fluorescent substance resin. Incidentally, besides dipping, coating may be made by another method such as sputtering, application, or painting.

Although this embodiment has shown the case where an epoxy resin is used as a base material for dispersing the silicone balls 30, 31 and 32, the invention is not limited thereto. For example, a transparent material such as silicone (silicone resin, silicone rubber or silicone elastomer), urea resin or glass may be used instead. Although this embodiment has shown the case where the silicone balls 30, 31 and 32 are dispersed into the fluorescent substance resin layer 27 uniformly, the invention may be applied also to the case where gradients are formed in the concentration distributions of the silicone balls 30, 31 and 32 in the fluorescent substance resin layer 27. For example, epoxy resins different in the concentrations of the silicone balls 30, 31 and 32 to be added is laminated successively on the light-emitting element 10. Although this embodiment has shown the case where all the silicone balls are dispersed into one epoxy resin to thereby form a fluorescent substance layer, the invention maybe applied also to the case where epoxy resins containing silicone balls dispersed therein respectively are prepared and dropped into the cup-like portion 25 individually to thereby form a fluorescent substance resin layer as a laminate of the resins containing different silicone balls dispersed therein respectively.

The fluorescent substance resin layer 27 may contain a diffusing agent such as titanium oxide, titanium nitride, tantalum nitride, aluminum oxide, silicon oxide, or barium titanate.

The light-emitting element 10, part of the lead frames 20 and 21 and the wires 40 and 41 are sealed with a sealing resin 50 made of an epoxy resin. The material of the sealing resin 50 is not particularly limited so long as the material is transparent. An epoxy resin is preferably used as the material of the sealing resin 50. From the point of view of adhesion between the sealing resin 50 and the fluorescent substance resin layer 27 and refractive index, the sealing resin 50 is preferably made of the same material as that of the fluorescent substance resin layer 27.

The sealing resin 50 is provided for protecting the device structure. When the shape of the sealing resin 50 is changed in accordance with the purpose, a lens effect can be given to the sealing resin 50. For example, the sealing resin 50 may be molded into a concave lens shape or a convex lens shape as well as the round shape shown in FIG. 1. The shape of the sealing resin 50 viewed from the light-extracting direction (above in FIG. 1) may be also a circular shape, an elliptic shape or a rectangular shape.

The silicone balls 30, 31 and 32 may be disposed also in the sealing resin 50.

Though not shown, a diffusing agent, and an ultraviolet absorber are dispersed in the sealing resin 50. When the diffusing agent is used, diffusion and color mixing of the light in the sealing resin can be promoted so that emission unevenness can be reduced. Examples of the diffusing agent used include titanium oxide, titanium nitride, tantalum nitride, aluminum oxide, silicon oxide, and barium titanate. On the other hand, when the ultraviolet absorber is used, the residual part of the ultraviolet light which has not used for excitation of the fluorescent substance can be prevented from being radiated out. Incidentally, either or both of the diffusing agent and the ultraviolet absorber may be omitted.

Figure 3:
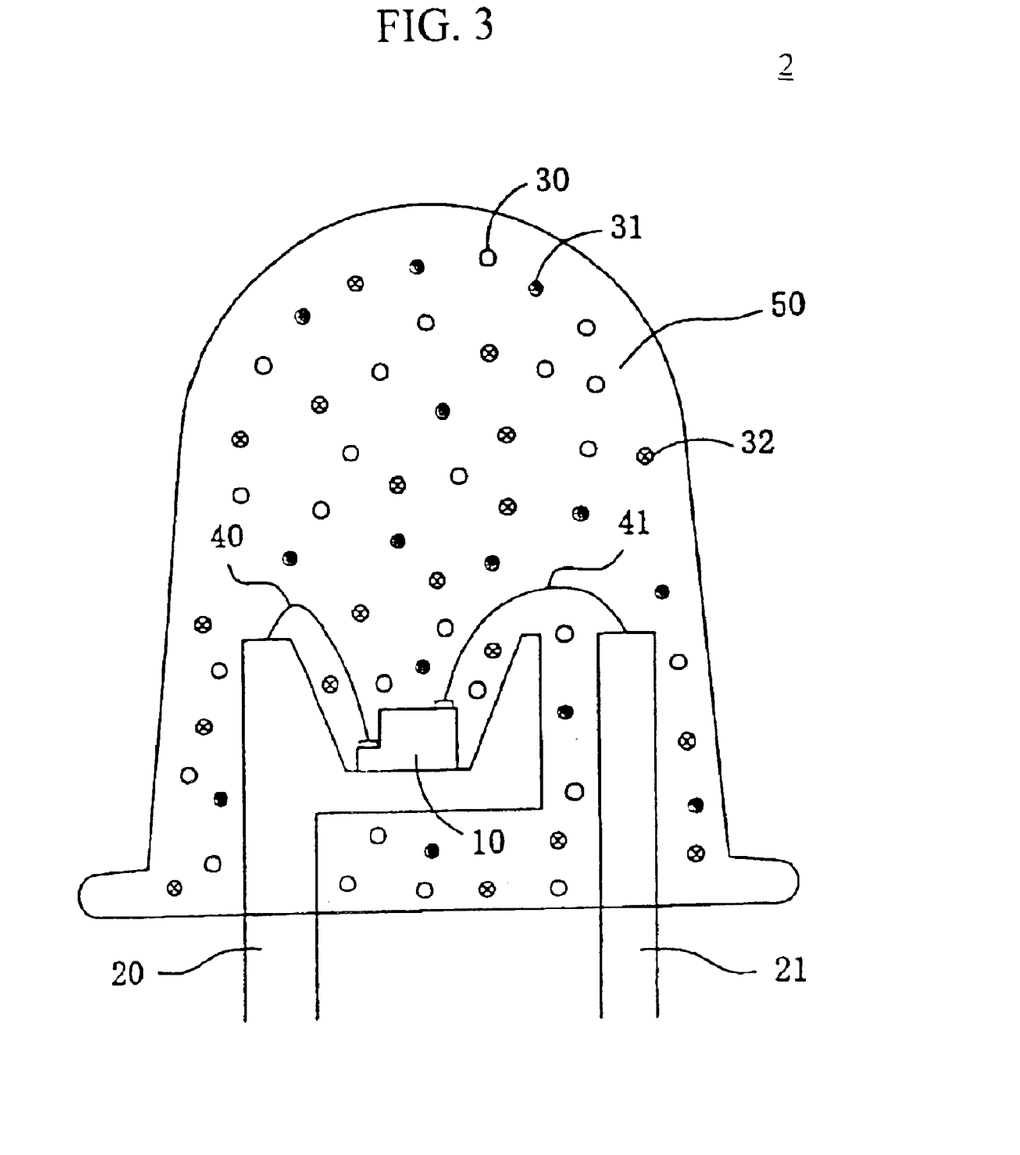
FIG. 3 is a view showing an LED as an example in which silicone balls are dispersed in a sealing resin.

When the silicone balls 30, 31 and 32 are added into the sealing resin 50 as shown in FIG. 3, the fluorescent substance resin layer 27 can be omitted. Incidentally, in FIG. 3, members the same as those in FIG. 1 are referenced correspondingly. Also in this case, gradients may be provided in the concentration distributions of the silicone balls 30, 31 and 32 in the sealing resin 50 in the same manner as in the fluorescent substance resin layer 27.

In the LED 1 configured as described above, the organic fluorescent substances contained in the silicone balls 30, 31, 32 respectively are irradiated with light in an ultraviolet region emitted from the light-emitting element 10, so that the organic fluorescent substances are excited to emit light. As a result, three types of fluorescence, that is, red fluorescence, green fluorescence and blue fluorescence, are generated. These types of fluorescence are mixed with a small part of visible light emitted from the light-emitting element, so that the mixed light is released out. As a result, white emitted light is obtained from the LED 1.

In addition to the light-emitting element 10, another light-emitting element may be used. A light-emitting element different in emission wavelength from the light-emitting element 10 is used as the other light-emitting element. When the other light-emitting element is used, the color of light emitted from the LED 1 can be changed or adjusted. Further, a plurality of light-emitting elements 10 may be used to enhanced luminance.

(Embodiment 2)

Figure 4:
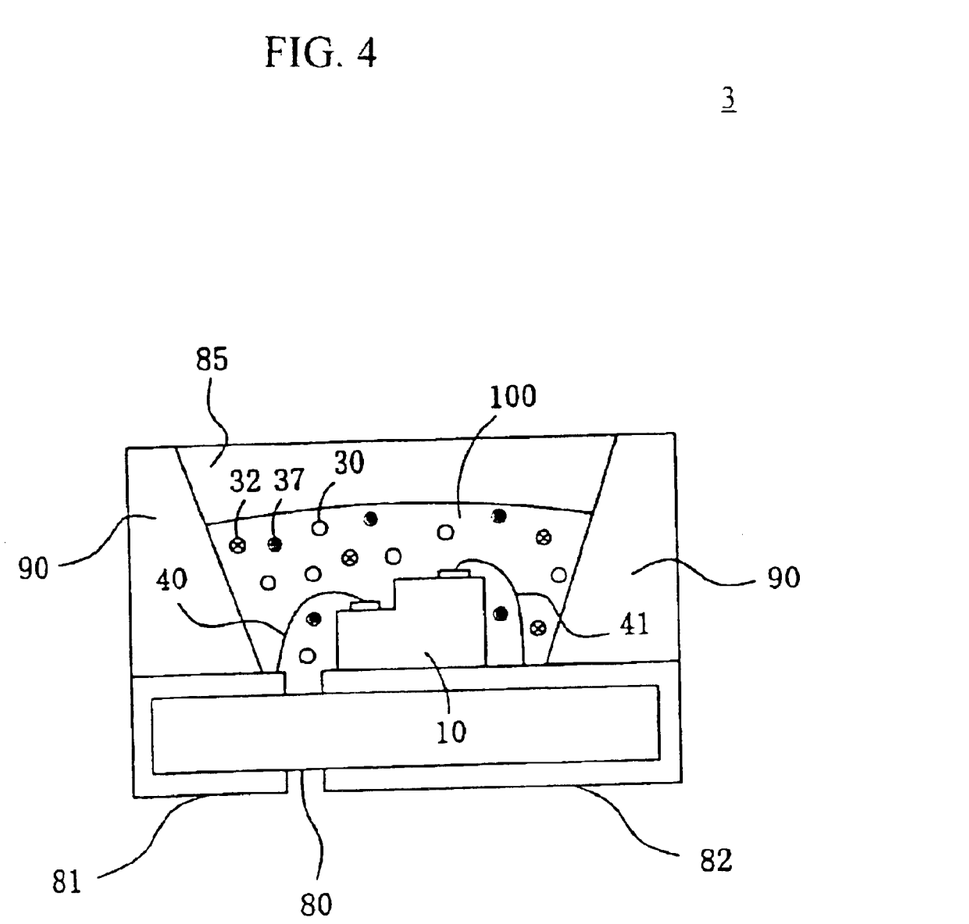
FIG. 4 is a view showing an SMD type LED as another embodiment of the invention.

FIG. 4 is a sectional view of an SMD type LED 3 as another embodiment of the invention. In Embodiment 2, members the same as those in the LED 1 of Embodiment 1 are referenced correspondingly and the description of these members is omitted. The LED 3 emits white light in the same manner as in Embodiment 1. For example, the LED 3 can be used in combination with a light guide for forming a surface light source or a linear light source. The LED 3 can be further used for forming various kinds of display devices.

The light-emitting element 10 is fixed to a substrate 80 by silver paste or the like. Wires 40 and 41 connect respective electrodes of the light-emitting element 10 to electrodes 81 and 82 provided on the substrate 80. The reference numeral 90 designates a reflector formed as the surroundings of the light-emitting element. The reflector 90 has a surface provided as a specular surface.

A cup-like portion formed by the substrate 80 and the reflector 90 is filled with a fluorescent substance resin layer 100 and a sealing resin 85. The fluorescent substance resin layer 100 is made of a silicone resin containing silicone balls 30 and 32 and an inorganic fluorescent substance 37 dispersed therein. The silicone balls 30 and 32 are made of spherical silicone resins impregnated with red and blue organic fluorescent substances respectively as described above. The inorganic fluorescent substance 37 is a green fluorescent substance $Y_2SiO_5:Ce^{3+}, Tb^{3+}$. The fluorescent substance resin layer 100 is formed by a method such as a potting method after the light-emitting element 10 is mounted. The sealing resin 85 is made of an epoxy resin. The sealing resin 85 is formed by the same method as the method for forming the fluorescent substance resin layer 100 after the fluorescent substance resin layer 100 is formed.

In the LED 3 configured as described above, when light in an ultraviolet region passes through the fluorescent substance resin layer 100, the light in the ultraviolet region emitted from the light-emitting element 10 excites the organic fluorescent substances contained in the silicone balls 30 and 32 and the inorganic fluorescent substance 37 to thereby emit light. The fluorescence generated thus and visible light emitted from the light-emitting element are mixed with each other in terms of the color of light, so that white light is radiated out as a whole.

Figure 5:
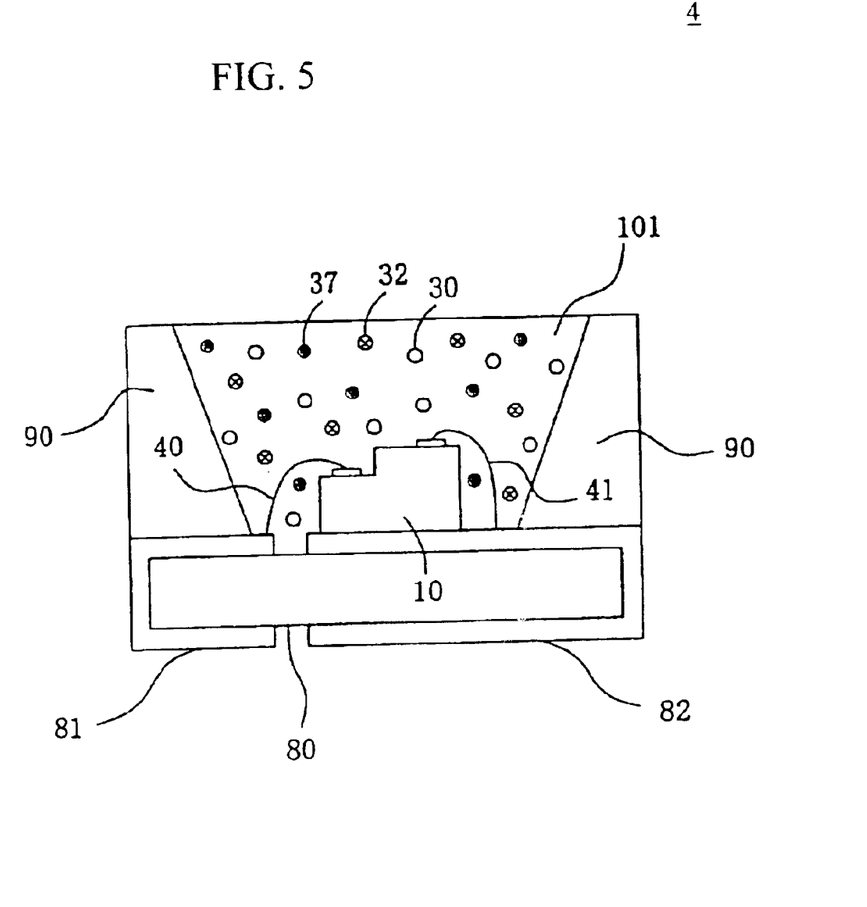
FIG. 5 is a view showing an SMD type LED as a further embodiment of the invention.

In the LED 3 shown in FIG. 4, the fluorescent substance resin layer 100 and the sealing resin 85 are provided separately. As shown in FIG. 5, silicone balls 30 and 32 and the inorganic fluorescent substance 37 may be dispersed in a sealing resin 101. Incidentally, in FIG. 5, members the same as those in FIG. 4 are referenced correspondingly.

Figure 6:
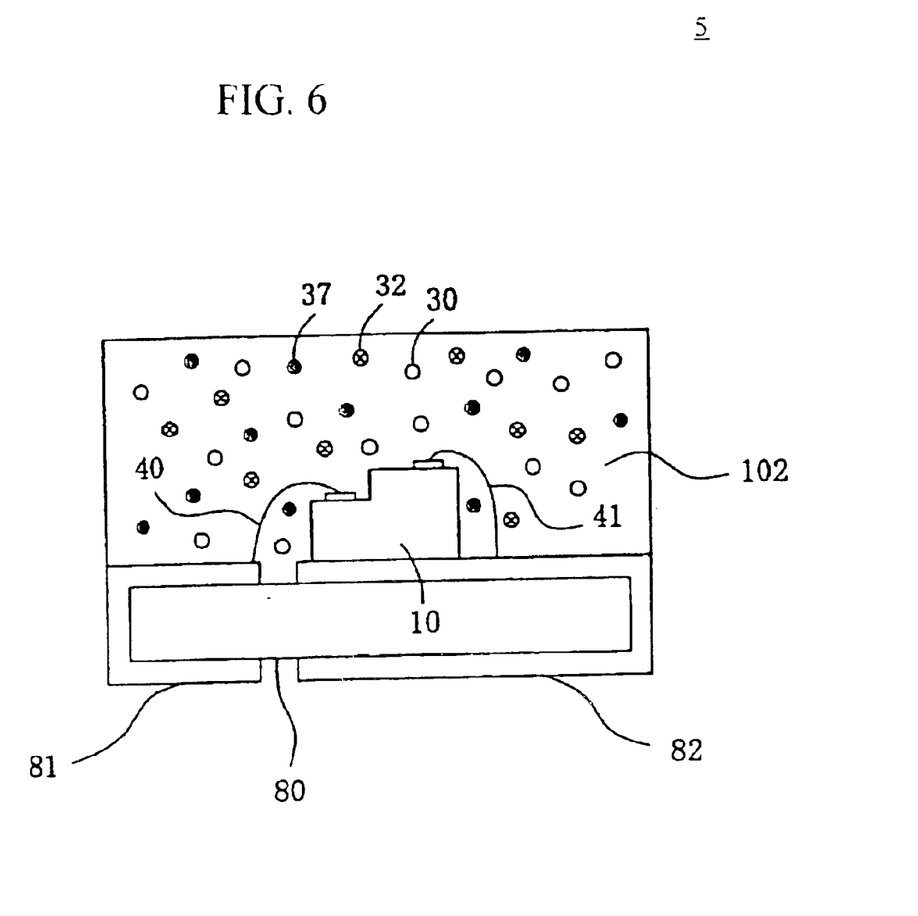
FIG. 6 is a view showing an SMD type LED as a further embodiment of the invention.

FIG. 6 shows an example of the configuration of an SMD type LED 5 without using any reflector 90. In the LED 5, a sealing resin 102 shaped like an approximate rectangle in section is formed so that the light-emitting element 10 is covered with the sealing resin 102. The sealing resin 102 is made of an epoxy resin containing silicone balls 30 and 32 and an inorganic fluorescent substance 37 dispersed therein. The sealing resin 102 can be formed by molding using a desired mold after the light-emitting element 10 is mounted on a substrate 80. Alternatively, a sealing resin 102 molded into a desired shape may be prepared so that the sealing resin 102 is bonded to the substrate 80 so that the light-emitting element 10 is covered with the sealing resin 102.

Incidentally, like the LED 1 obtained in Embodiment 1, the sealing resin 85 in the LED 3 shown in FIG. 4, the fluorescent resin layer 100 and/or the sealing resin 85 in the LED 4 shown in FIG. 5, and the sealing resin 102 in the LED 5 shown in FIG. 6 may contain either a diffusing agent or an ultraviolet absorber or may contain at least two kinds of diffusing agents and ultraviolet absorbers in combination.

The invention is not limited at all to the description of the mode for carrying out the invention and the description of the embodiments. The invention includes various modifications that can be conceived easily by those skilled in the art, without departing from the description of the scope of claim.

What is claimed is:

1. A light-emitting device, comprising:
    a light-emitting element;
    a first sealing member that covers a light release side of said light-emitting element; and
    a plurality of silicone members that include at least one organic fluorescent substance, said plurality of silicone members being scattered within said first sealing member.

2. A light-emitting device according to claim 1, wherein a main emission peak wavelength of said light-emitting element comprises a wavelength range of from 360 nm to 400 nm.

3. A light-emitting device according to claim 1, wherein said light-emitting element comprises a Group III nitride compound semiconductor light-emitting element.

4. A light-emitting device according to claim 1, wherein each of said plurality of silicone members comprises a ball-like shape.

5. A light-emitting device according to claim 4, wherein said each of said plurality of silicone members comprises a diameter in a range of from 1 um to 50 um.

6. A light-emitting device according to claim 1, wherein said plurality of silicone members comprises a silicone resin impregnated with said at least one organic fluorescent substance.

7. A light-emitting device according to claim 1, wherein said plurality of silicone members is localized on a light-emitting element side of said first sealing member.

8. A light-emitting device according to claim 1, wherein said at least one organic fluorescent substance comprises a plurality of organic fluorescent substances.

9. A light-emitting device according to claim 1, wherein said plurality of silicone members comprises a plurality of first silicone members, which include a first organic fluorescent substance, and a plurality of second silicone members, which include a second organic fluorescent substance.

10. A light-emitting device according to claim 1, wherein said first sealing member comprises an epoxy resin.

11. A light-emitting device according to claim 1, further comprising at least one inorganic fluorescent substance scattered within said sealing member.

12. A light-emitting device according to claim 11, wherein said inorganic fluorescent substance comprises a green fluorescent substance.

13. A light-emitting device according to claim 1, further comprising a second sealing member that covers said first sealing member.

14. A light-emitting device according to claim 1, wherein a main emission peak wavelength of said light-emitting element is not longer than 500 nm.

15. A light-emitting device according to claim 1, further comprising:
   a layer disposed between said light-emitting element and said first sealing member, said layer comprising a substance different from that of said first sealing member.

16. A light-emitting device according to claim 1, wherein said plurality of silicone members is scattered within a part of said first sealing member.

17. A light-emitting device according to claim 1, wherein said first sealing member comprises a laminated structure including a first layer, which includes a first concentration of said plurality of silicone members, and a second layer, which includes a second concentration of said plurality of silicone members.

18. A light-emitting device according to claim 1, wherein said second sealing member includes at least one fluorescent substance.

19. A light-emitting device according to claim 1, wherein said light-emitting element is disposed within a cup-like portion, which reflects light emitted from said light-emitting element toward said light release side.

20. A light-emitting device according to claim 19, wherein a bottom of said cup-like portion comprises an electrode.

21. A light-emitting device, comprising:
   a light-emitting element;
   a sealing member formed on said light-emitting element; and
   a plurality of silicone members which comprise at least one organic fluorescent substance, formed in said sealing member.

22. A sealing member for a light-emitting device, comprising:
   a sealing resin formed on a light-emitting element; and
   a plurality of silicone members which comprise at least one organic fluorescent substance, formed in said sealing resin.

23. A sealing member according to claim 22, wherein said plurality of silicone members are coated with said sealing resin.

* * * * *